US009722161B2

(12) United States Patent
Lei et al.

(10) Patent No.: US 9,722,161 B2
(45) Date of Patent: *Aug. 1, 2017

(54) P-N SEPARATION METAL FILL FOR FLIP CHIP LEDS

(71) Applicant: Koninklijke Philips N.V., Eindhoven (NL)

(72) Inventors: Jipu Lei, San Jose, CA (US); Yajun Wei, San Jose, CA (US); Alexander H. Nickel, San Jose, CA (US); Stefano Schiaffino, San Jose, CA (US); Daniel Alexander Steigerwald, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 12 days.

This patent is subject to a terminal disclaimer.

(21) Appl. No.: 14/977,565

(22) Filed: Dec. 21, 2015

(65) Prior Publication Data

US 2016/0126436 A1    May 5, 2016

Related U.S. Application Data

(63) Continuation of application No. 14/112,279, filed as application No. PCT/IB2012/052062 on Apr. 25, 2012, now Pat. No. 9,219,209.

(Continued)

(51) Int. Cl.
*H01L 33/62* (2010.01)
*H01L 33/00* (2010.01)
(Continued)

(52) U.S. Cl.
CPC .............. *H01L 33/62* (2013.01); *H01L 24/14* (2013.01); *H01L 33/005* (2013.01);
(Continued)

(58) Field of Classification Search
CPC ....... H01L 33/62; H01L 24/14; H01L 33/005; H01L 33/0079; H01L 33/486;
(Continued)

(56) References Cited

U.S. PATENT DOCUMENTS 6,444,998 B1   9/2002   Taniguchi et al.
7,210,819 B2   5/2007   Jiang et al.
(Continued)

FOREIGN PATENT DOCUMENTS

JP    2007-300063 A    11/2007
KR    100752719 B1     8/2007
RU    2231171 C1       6/2004

OTHER PUBLICATIONS

First Office Action, China Application #201280024680.X, dated Dec. 1, 2015, 18 pages.

(Continued)

*Primary Examiner* — Fernando L Toledo
*Assistant Examiner* — Neil Prasad
(74) *Attorney, Agent, or Firm* — Brian D. Ogonowsky; Patent Law Group LLP

(57) ABSTRACT

A light emitting diode (LED) structure has semiconductor layers, including a p-type layer, an active layer, and an n-type layer. The p-type layer has a bottom surface, and the n-type layer has a top surface through which light is emitted. Portions of the p-type layer and active layer are etched away to expose the n-type layer. The surface of the LED is patterned with a photoresist, and copper is plated over the exposed surfaces to form p and n electrodes electrically contacting their respective semiconductor layers. There is a gap between the n and p electrodes. To provide mechanical support of the semiconductor layers between the gap, a dielectric layer is formed in the gap followed by filling the gap with a metal. The metal is patterned to form stud bumps (Continued)

that substantially cover the bottom surface of the LED die, but do not short the electrodes. The substantially uniform coverage supports the semiconductor layer during subsequent process steps.

19 Claims, 4 Drawing Sheets

Related U.S. Application Data

(60) Provisional application No. 61/489,280, filed on May 24, 2011.

(51) Int. Cl.
*H01L 33/48* (2010.01)
*H01L 23/00* (2006.01)

(52) U.S. Cl.
CPC ........ *H01L 33/0079* (2013.01); *H01L 33/486* (2013.01); *H01L 24/13* (2013.01); *H01L 2224/13008* (2013.01); *H01L 2224/13022* (2013.01); *H01L 2224/13144* (2013.01); *H01L 2224/1403* (2013.01); *H01L 2224/14051* (2013.01); *H01L 2224/16225* (2013.01); *H01L 2224/16227* (2013.01); *H01L 2224/17517* (2013.01); *H01L 2924/01019* (2013.01); *H01L 2924/12041* (2013.01); *H01L 2924/12042* (2013.01); *H01L 2924/181* (2013.01); *H01L 2924/351* (2013.01); *H01L 2933/0066* (2013.01)

(58) Field of Classification Search
CPC ........... H01L 24/13; H01L 2224/13008; H01L 2224/13022; H01L 2224/13144; H01L 2224/1403; H01L 2224/14051; H01L 2224/16225; H01L 2224/16227; H01L 2224/17517; H01L 2924/01019
See application file for complete search history.

(56) References Cited

U.S. PATENT DOCUMENTS

| 7,285,801 | B2 | 10/2007 | Eliashevich et al. |
| 8,679,869 | B2 | 3/2014 | Aldaz et al. |
| 8,729,592 | B2 | 5/2014 | Iduka et al. |
| 8,748,917 | B2 | 6/2014 | Song et al. |
| 2001/0032985 | A1 | 10/2001 | Bhat et al. |
| 2002/0171087 | A1 | 11/2002 | Krames et al. |
| 2004/0211972 | A1 | 10/2004 | Du et al. |
| 2006/0278885 | A1 | 12/2006 | Tain et al. |
| 2007/0096130 | A1 | 5/2007 | Schiaffino |
| 2007/0114557 | A1 | 5/2007 | Shelton et al. |
| 2007/0246735 | A1 | 10/2007 | Yahata et al. |
| 2007/0262338 | A1 | 11/2007 | Higashi et al. |
| 2008/0083929 | A1 | 4/2008 | Fan et al. |
| 2009/0121241 | A1 | 5/2009 | Keller et al. |
| 2010/0044743 | A1 | 2/2010 | Liu et al. |
| 2010/0078670 | A1 | 4/2010 | Kim et al. |
| 2010/0224902 | A1 | 9/2010 | Epler et al. |
| 2011/0284910 | A1 | 11/2011 | Iduka et al. |

OTHER PUBLICATIONS

First Office Action, Japan Application #2014-511976, dated Dec. 22, 2015, 4 pages.
RU Notice of Allowance, Application 2013156628, Jul. 19, 2016, 14 pps.
EPO as ISA, PCT/IB2012/052062, filed Apr. 25, 2012, "International Search Report and Written Opinion", mailed Oct. 23, 2012, 13 pages.
TW Office Action, Application 101118425, Jul. 22, 2016, 9 pps.

P-N SEPARATION METAL FILL FOR FLIP CHIP LEDS

CROSS-REFERENCE TO RELATED APPLICATIONS

This application is a continuation of U.S. patent application Ser. No. 14/112,279, filed Oct. 17, 2013, now U.S. Pat. No. 9,219,209, to be issued on Dec. 22, 2015, which is the US National Phase application under 35 USC 371 of International Application No. PCT/IB2012/052062, filed on Apr. 25, 2012, which claims the benefit of U.S. Provisional Patent Application No. 61/489,280, filed on May 24, 2011. These applications are hereby incorporated by reference herein.

FIELD OF THE INVENTION

This invention relates to light emitting diodes (LEDs) and, in particular, to a flip chip LED having a robust mechanical support structure and improved thermal resistance.

BACKGROUND

Flip chip LEDs are desirable in many applications since they do not use wire bonding. Both electrodes are located on a bottom surface of the LED for direct bonding to metal pads on a submount. Bonding may be accomplished by ultrasonic bonding, solder, conductive adhesive, or other means. Light exits the surface of the LED opposite the electrodes.

In a typical LED flip chip, the epitaxial p-type layer is the bottom layer and is contacted by the bottom anode electrode. A portion of the p-type layer and active layer must be etched away to expose the underside of the epitaxial n-type layer, which allows a connection to the bottom cathode electrode. This etching creates distributed vias through the p-type layer that expose the bottom surface of the n-type layer. The via openings are then insulated, and metal is deposited in the openings for contacting the n-type layer.

Such topography is typically achieved by dry-etch of the semiconductor material (e.g., GaN) in a plasma environment.

The metal contacting the n-type layer and the metal contacting the p-type layer are separated by gaps. Therefore, there is no mechanical support of the brittle semiconductor layers between the metal electrodes.

At the end of wafer level processing, the growth substrates of the LED wafers are thinned and individual dies are formed by singulation. The LED electrodes are then bonded to metal pads on a submount tile, populated by many other LEDs. To prevent breakage of the semiconductor layers, it is known to inject a dielectric, organic based underfill material between the semiconductor layers and the submount. Such an injection process is time-consuming, since the submount tile may support hundreds of LEDs.

To increase light extraction, after the LED electrodes are bonded to the submount tile and the underfill is injected, the growth substrate is removed and thin semiconductor layers, with a typical thickness about 5 microns, are exposed. Such LED structures are referred to as thin film flip chip (TFFC) LEDs. The semiconductor layers are very delicate and susceptible to breakage, and the thinning and the substrate removal process create stresses on the semiconductor layers. Thus, the underfill is required. The submount tile is then singulated, making the mounted devices ready for the next level of packaging.

The underfill material, such as a silicone or epoxy-based composite material (e.g., a molding compound), inherently has some material mismatch with the semiconductor layers, such as coefficient of thermal expansion (CTE) mismatch and Young's modulus mismatch. This leads to delamination or other reliability problems during temperature cycling or other stress conditions.

What is needed is a technique to form a robust TFFC without requiring an underfill for mechanical support.

SUMMARY

In one embodiment of the invention, a flip chip LED is formed by growing n-type layers, an active layer, and p-type layers over a growth substrate. Portions of the p-type layers and active layer are then etched away to expose the n-type layer for electrical contact. Metal electrodes for the n-type layers and p-type layers are then formed, where the n and p electrodes are separated by gaps to avoid shorting.

To provide mechanical support of the bottom surface of the LED between the electrodes, the sidewalls and bottom surface of the gap are insulated with a dielectric layer, and the gap is filled with a metal by electroplating. The metal filling the gap is electrically insulated from at least one of the electrodes to prevent shorting. When the LED electrodes are bonded to the pads of a submount, the metal filling the gap abuts one of the pads. Therefore, the entire bottom surface of the LED is substantially supported by the combination of the electrodes and the metal filling the gap after mounting the LED on a submount tile, thus obviating the need for an underfill. Therefore, the drawbacks of an underfill are avoided. The CTE and Young's modulus of the metal are much closer to those of the semiconductor layers than those of organic based underfill materials, thus greatly increasing the reliability of the LED during the thermal stresses incurred in operation.

With the elimination of a tile level underfill process, more LED packaging steps can be processed at wafer level, resulting in better production scalability and further manufacturing cost reduction. An example is that the LED wafers are bonded to a carrier wafer with corresponding electrode pads properly aligned, or the plated structure is sufficiently thick and mechanically stiff to form a wafer carrier. The LEDs on the carrier wafer are then processed at wafer level simultaneously, such as by removing the growth substrate, roughening the top semiconductor layer for increased light extraction, encapsulating the LEDs, and singulating for next level packaging. The metal virtually covering the bottom surface of the semiconductor layers provides good mechanical support for the semiconductor layers during the wafer level processing.

Other embodiments of the methods and structures are also described.

BRIEF DESCRIPTION OF THE DRAWINGS

Elements labeled with the same numerals in the various figures may be the same or equivalent.

DETAILED DESCRIPTION

FIGS. 1-7 illustrate cross-sections of a small portion of an LED wafer showing only a single LED, where the central portion of the single LED is greatly reduced laterally so as to show detail of the side edges. To simplify the description, only the periphery of the n-type layer for each LED is contacted by an electrode. In an actual device, the n-type layer may be contacted by distributed electrodes for improved current spreading.

Figure 1:
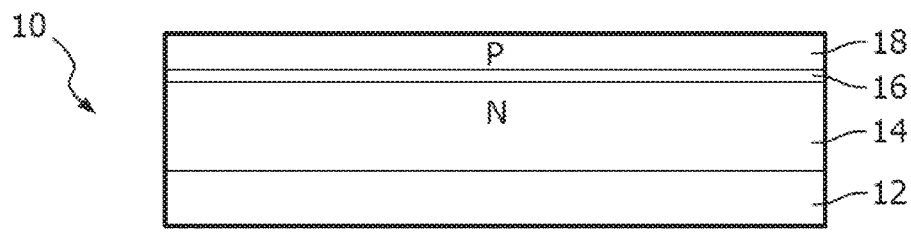
FIG. 1 is a simplified cross-sectional view of LED semiconductor layers grown on a growth substrate. The p-type layer, active layer, and n-type layer may each comprise multiple layers.

FIG. 1 illustrates conventional LED semiconductor GaN layers 10 epitaxially grown over a sapphire substrate 12 and represents, in the order of layers grown, a nucleation layer, stress relief layers, n-layers 14, active layers 16 (emitting light), p-layers 18, and any other semiconductor layers that are used to form LEDs. The LEDs formed on the wafer may be AlInGaN LEDs, depending on the desired peak wavelength desired. Alternatively, the LEDs need not be GaN based and may be any other type of LED using any type of growth substrate. The invention is applicable to forming any LED as a flip chip.

Figure 2:
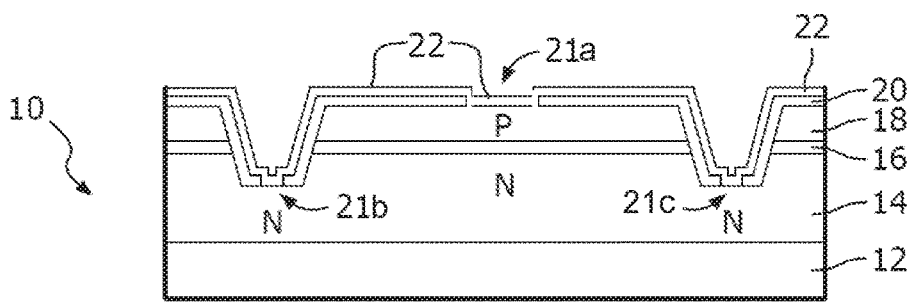
FIG. 2 illustrates portions of the p-type layer and active layer etched away, to allow ohmic contact to the n-type layer to form a flip chip, and a dielectric layer and copper seed layer formed over the structure.

FIG. 2 illustrates that the wafer has been masked and dry etched to remove the p-layers 18 and active layers 16 from the edges of the LED to expose the surface of the p-layers 16 around the periphery of the LED. This is performed for all the LEDs on the wafer. Such a process is conventional to form a flip chip.

FIG. 2 also shows a dielectric layer 20, such as $SiN_x$, deposited over the surface of the wafer and then etched, using conventional techniques, at areas 21a to expose a portion of the surface of the p-layers 18 and at areas 21b and 21c to expose potions of a surface of n-layers 14. The deposition may be by spray coating. Any suitable dielectric material may be used. The dielectric layer 20 covers the side walls of the opening in the p-layers 18 and active layers 16 and covers a portion of the surface of the p-layers 18.

A copper seed layer 22 is formed over the surface of the wafer, which makes ohmic contact to the n and p layers through the openings in the dielectric layer 20 at areas 21a-21c. A barrier layer, such as containing nickel, tungsten, chromium, vanadium and/or titanium, may be formed between the copper seed layer 22 and the semiconductor layers to avoid migration of Cu atoms. The copper seed layer 22 and barrier layer may be deposited over the entire wafer using any of a number of well known techniques, such as CVD, sputtering, etc.

In FIGS. 3-8, the GaN layers 10 will be referred to hereinafter as a single semiconductor GaN layer 10, and the growth substrate is ignored, for simplicity. The thickness of the p-layers 18 and active layers 16 is only a few microns, such as on the order of 5 microns, which is essentially planar relative to the much thicker plated electrodes (e.g., on the order of 50-100 microns) described below. Therefore, the height of the semiconductor mesa (layers 16 and 18) shown in FIG. 2 is ignored for simplicity. The thicknesses of the various layers in the figures are not to scale.

Figure 3:
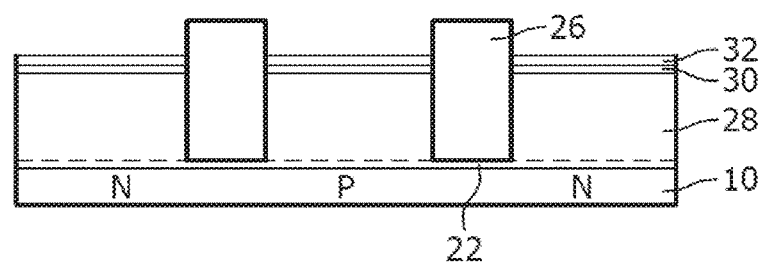
FIG. 3 illustrates a simplified version of the LED semiconductor layers (the thickness of the p-type layer and active layer has been ignored for simplicity) having formed over the surface photoresist portions, followed by plating steps to form at least a layer of copper electrically contacting the n-type layer and the p-type layer.

In FIG. 3, photoresist portions 26 are deposited and patterned by conventional lithographic techniques to expose only those portions of the seed layer 22 that are to be plated with copper. These exposed areas include the areas where the copper seed layer 22 electrically contacts the semiconductor layers at areas 21a-21c in FIG. 2. Other dielectric materials, such as an oxide or nitride, may be used as a mask instead of the photoresist.

The exposed portions of the seed layer 22 are then plated with copper 28 to a desired thickness. Various well known electroplating techniques can be used, where the seed layer 22 is coupled to a potential, and the wafer is immersed in an electrolyte for transporting copper atoms from an electrode. Electroless plating may also be used. The copper 28 is advantageous for heat spreading and current spreading over the LED surface. Other metals and deposition techniques may be used.

A thin nickel layer 30 and gold layer 32 are then plated over the copper 28 for providing a good bonding interface to submount pads.

Figure 4:
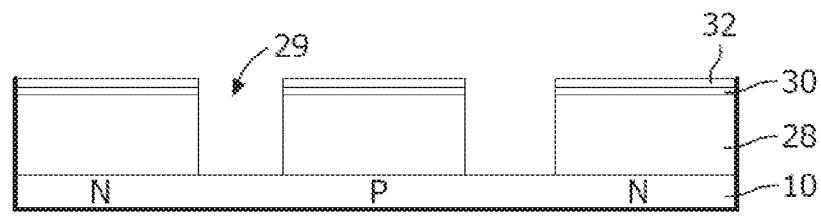
FIG. 4 illustrates the structure of FIG. 3 after the photoresist portions have been stripped and after the exposed seed layer has been etched away.

In FIG. 4, the photoresist portions 26 are stripped in a solution, leaving gaps 29, and the exposed seed layer 22 is then etched away using conventional techniques. The seed layer below the copper 28 will no longer be separately identified.

The copper 28 electrode electrically contacting the p-layers is isolated from the copper 28 electrode electrically contacting the n-layers by the gaps 29.

Figure 5:
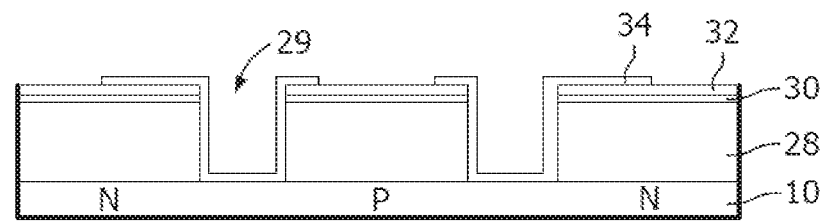
FIG. 5 illustrates a dielectric layer insulating the sidewalls and bottom surface of the gap between the metal electrodes.

In FIG. 5, a dielectric layer 34 of, for example, $SiN_x$, is then deposited over the wafer and patterned using conventional techniques. The deposition may be by spray coating or other suitable method. Any suitable low-K (dielectric constant) material may be used. The dielectric layer 34 is patterned to cover the sidewall and bottom surfaces in the gap 29 between adjacent copper 28 plated electrodes. The patterned dielectric layer 34 also covers a small area over the top surface of the gold layer 32 to ensure no sides of the plated electrodes are exposed and to provide a dielectric surface for supporting a metal layer, described below.

Figure 6:
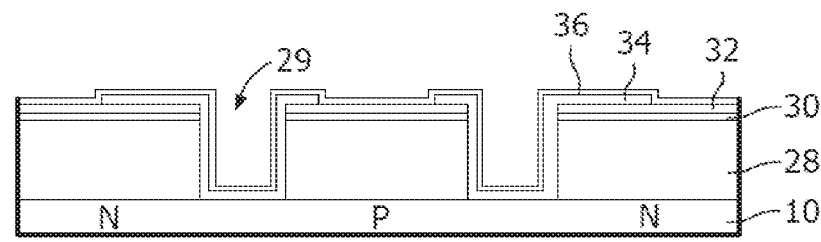
FIG. 6 illustrates a gold seed layer sputtered on the surface of the dielectric layer. Photoresist portions (not shown) are then formed to expose areas of the gold seed layer where gold is to be plated.

In FIG. 6, a thin gold seed layer 36 is sputtered over the wafer surface.

A photoresist (not shown) is then patterned over the seed layer 36 to expose only those areas that are to be plated with gold.

Figure 7:
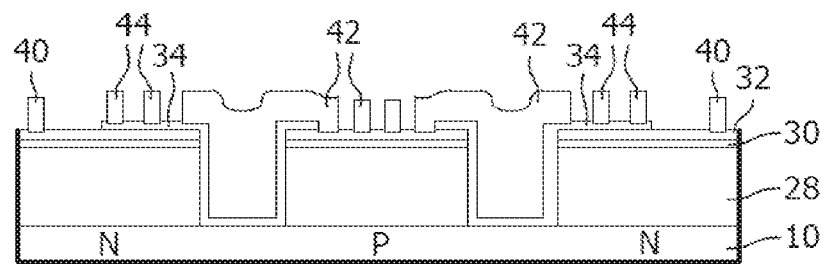
FIG. 7 illustrates the structure after the exposed seed layer is plated with gold and after the seed layer is etched back. The gold fills the gaps between the copper electrodes and covers a portion of the n and p electrodes.

As shown in FIG. 7, the exposed seed layer 36 is then electroplated with gold in a single electroplating step to fill the gaps 29 (FIG. 6) with a conformal growth and form stud bumps simultaneously for subsequent die attach application. After photoresist removal, the exposed seed layer 36 is then etched back to form the following groups of gold stud bumps: 1) gold stud bumps 40 electrically contacting the n-type layers via the gold layer 32; 2) gold stud bumps 42 electrically contacting the p-type layers via the gold layer 32; and 3) gold stud bumps 44 over the dielectric layer 34 which are electrically insulated from both the n-type layers and the p-type layers. Note that the gold stud bumps 44 are formed overlying the dielectric layer 34 on the copper 28 electrode for the n-type layers. The gold stud bumps 44 act as isolation buffers between the closely spaced n and p electrodes and provide mechanical support for the surface next to the gap.

By providing gold stud bumps, rather than a larger layer of gold, the gold is more easily melded in the submount gold pads when ultrasonically bonding the LED electrodes to the submount pads.

The resulting LED wafer can then be singulated for die attach, or can be bound to a carrier wafer for further processing at the wafer level. Alternatively, the structure of the copper 28 layer can be sufficiently thick and mechanically stiff so as to act as a carrier wafer for continued wafer level packaging processing.

Figure 8:
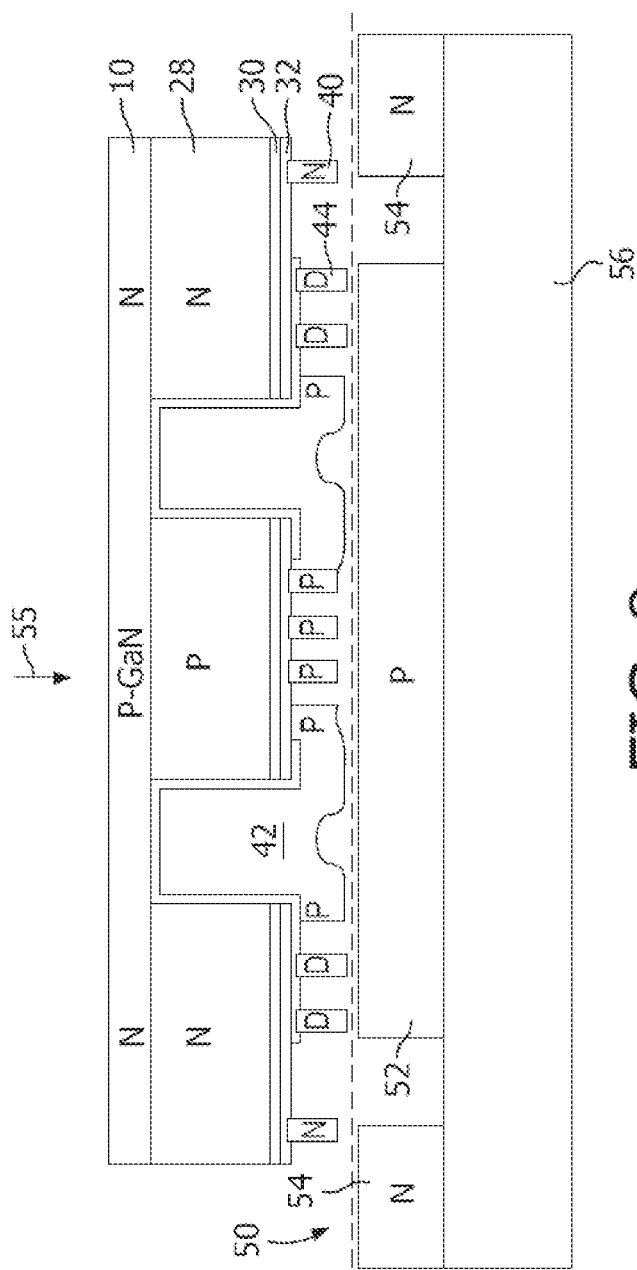
FIG. 8 illustrates the LED chip mounted to a submount wafer for further processing.

In one embodiment, shown in FIG. 8, each individual LED die is then mounted on a submount wafer 50 having, for each LED die, a central gold pad 52 for the p-contact and a peripheral gold pad 54 for the n-contact. The contact pad and electrode configuration may be much more complex than shown in FIG. 8. For example, the n-electrodes for the LED die may be distributed over the surface of the LED die by vias through the p-layers and active layers, and the pads on the submount wafer would correspond to the locations of the electrodes on the LED die. The body 56 of the submount wafer 50 may be a ceramic or other suitable thermally conductive material.

The polarities of the gold stud bumps on the LED die are designated as p, n, and d (for no polarity). The spacing between the gold stud bumps 40, 42, 44 may be very small since the spacing is determined by the masking for the plating, which can be made very precise. Although, the gold stud bump 42 at least partially filling the gap may not be planar with the other gold stud bumps 40 and 44, the gold stud bump 42 provides mechanical support of the gap area. Also, due to the relatively malleable characteristics of gold, the ultrasonic bonding of the LED electrodes to the submount pads will somewhat flatten out any high points, providing substantially uniform contact over the entire bottom surface of the LED die. Therefore, substantially the entire bottom surface of the LED die is substantially uniformly supported by gold stud bumps, providing good mechanical support for the semiconductor layers during subsequent processing.

The pads 52 and 54 on the submount wafer 50 may be formed close together without undue tolerance requirements for the placement of the LED die, since the gold stud bumps 44 are electrically isolated and will not short if some of the bumps 44 contact a p-metal pad 52 and some contact an adjacent n-metal pad 54 due to misalignment.

In addition to the gold stud bumps 42 providing mechanical support by filling the gap between the copper 28, they also increase the conductivity of the submount pad 52 to the p-type layers due to the added electrode area.

In one embodiment, the LED dies on the submount wafer 50 are then subjected to a substrate laser lift-off process, where the sapphire growth substrate is lifted off after the LED die is subjected to a laser pulse. This creates a high downward pressure 55 on the semiconductor layers. The semiconductor layers are prevented from breaking due to the metal support of the gold stud bumps over virtually the entire back surface of the LED die.

The LED dies are then subject to a thinning process, which may use chemical-mechanical polishing (CMP) or other technique, which thins the semiconductor layers to only a few microns. The exposed top surface is then roughened using an etching process to increase light extraction.

The LED dies may then be encapsulated, such as by molding lenses over all the dies.

The submount wafer 50 is then singulated (e.g., sawed) to form individual LEDs.

Figure 9:
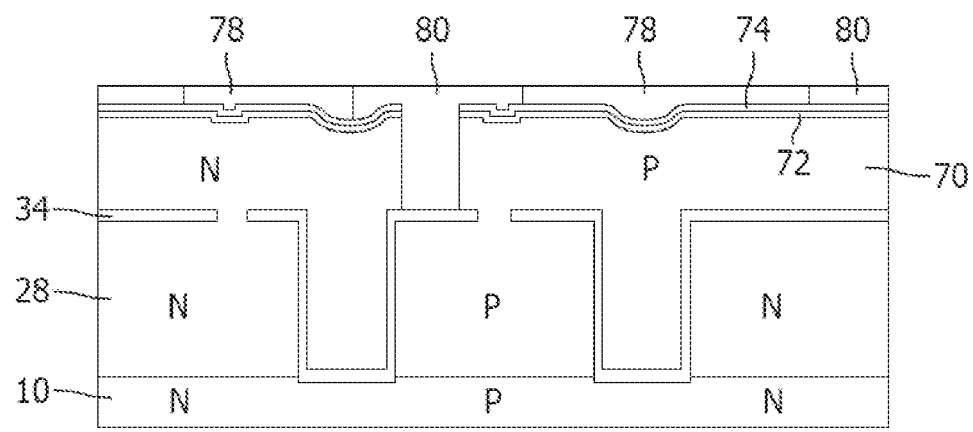
FIG. 9 illustrates a portion of an LED die having another electrode configuration, where electrical contact is made to both the n and p-type layers by the metal filling the gap.

FIG. 9 illustrates another embodiment of the electrode configuration on the LED die. No stud bumps are formed. After the copper 28 is plated over the semiconductor layers to electrical contact the n and p layers, the dielectric layer 34 is deposited and patterned to expose portions of the n and p copper 28 electrodes. A copper seed layer (not shown) is then deposited over the surface and masked with a photoresist to expose only those portions to be plated. A layer of copper 70 is then electroplated over the exposed seed layer to fill the gap between the copper 28 electrodes. The copper 70 is then plated with a nickel layer 72 and a gold layer 74. A conventional solder mask material 80 is then patterned over the surface, and solder paste 78 is applied to the exposed gold layer 74 for die attach to pads of a submount. Upon heating, the solder paste 78 bonds to the submount pads.

Other electrode configurations are also envisioned.

When the LEDs are energized, light is emitted through the n-type layers overlying the p-layers and active layers. The electrode metal (e.g., the gold or nickel barrier layer) reflects light back up through the LED.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A light emitting diode (LED) flip chip structure comprising:
    semiconductor layers, including a first conductivity layer, an active layer, and a second conductivity layer, the semiconductor layers having a bottom surface for facing a bonding surface and a top surface through which light is emitted;
    a first electrode opposing the bottom surface and electrically connected to the first conductivity layer;
    a second electrode opposing the bottom surface and electrically connected to the second conductivity layer;
    a first dielectric layer insulating a sidewall of the first electrode and an opposing sidewall of the second electrode, wherein there is at least one gap between the first dielectric layer on the sidewall of the first electrode and the first dielectric layer on the opposing sidewall of the second electrode; and
    a first metal layer, formed separately from the first electrode and the second electrode, a first portion of the first metal layer at least partially filling the at least one gap and electrically insulated from the second electrode,
    wherein the first metal layer forms a bonding metal on the bottom surface for bonding to the bonding surface to conduct current to the first conductivity layer via the first electrode.

2. The structure of claim 1 wherein a first portion of the first dielectric layer covers a portion of the second electrode, and a second portion of the first metal layer is formed overlying the first portion of the first dielectric layer.

3. The structure of claim 2 wherein the second portion of the first metal layer forms a first group of stud bumps that contact pads on the bonding surface.

4. The structure of claim 3 wherein the first group of stud bumps is electrically insulated from the first electrode, the second electrode, and the first portion of the first metal layer.

5. The structure of claim 1 wherein the first conductivity layer comprises a p-type conductivity layer, and the second conductivity layer comprises an n-type conductivity layer, wherein portions of the p-type conductivity layer and active layer have been removed to expose a portion of the n-type conductivity layer for making electrical contact to the second electrode.

6. The structure of claim 1 wherein the first metal layer is a plated metal.

7. The structure of claim 1 wherein the first metal layer comprises stud bumps overlying the first electrode and the second electrode.

8. The structure of claim 1 wherein the bonding surface comprises a submount, wherein the structure further comprises the submount having pads, wherein the first electrode, the second electrode, and portions of the first metal layer are bonded to the pads.

9. The structure of claim 1 wherein the first portion of the first metal layer at least partially filing the at least one gap is electrically connected to the first electrode by a second portion of the first metal layer extending over an edge of the first dielectric layer.

10. The structure of claim 1 wherein the bonding surface comprises a submount, wherein the structure further comprises the submount having pads, wherein the first electrode, the second electrode, and portions of the first metal layer are bonded to the pads,
wherein portions of the first metal layer form stud bumps that overlie the first electrode and the second electrode, and
wherein the stud bumps over the second electrode are electrically insulated from the first portion of the first metal layer at least partially filling the at least one gap.

11. The structure of claim 10 wherein the stud bumps over the first electrode are electrically connected to the first electrode and to the first portion of the metal layer.

12. The structure of claim 1 wherein the first metal layer at least partially mechanically supports the semiconductor layers.

13. The structure of claim 1 wherein the bonding surface comprises a submount wafer having mounted thereon a plurality of LED flip chips, wherein the first metal layer at least partially mechanically supports the semiconductor layers when the first electrode, the second electrode, and first metal layer are bonded to pads of the submount wafer during wafer level processing of the plurality of LEDs.

14. A method for forming a light emitting diode (LED) flip chip structure comprising:
forming semiconductor layers, including a first conductivity layer, an active layer, and a second conductivity layer, the semiconductor layers having a bottom surface for facing a bonding surface and a top surface through which light is emitted;
etching portions of the first conductivity layer and active layer to expose a portion of the second conductivity layer;
forming a first electrode opposing the bottom surface and electrically connected to the first conductivity layer;
forming a second electrode opposing the bottom surface and electrically connected to the second conductivity layer;
forming a first dielectric layer insulating a sidewall of the first electrode and an opposing sidewall of the second electrode, wherein there is at least one gap between the first dielectric layer on the sidewall of the first electrode and the first dielectric layer on the opposing sidewall of the second electrode; and
forming a first metal layer, formed separately from the first electrode and the second electrode, a first portion of the first metal layer at least partially filling the at least one gap and electrically insulated from the second electrode,
wherein the first metal layer forms a bonding metal on the bottom surface for bonding to the bonding surface to conduct current to the first conductivity layer via the first electrode.

15. The method of claim 14 wherein a first portion of the first dielectric layer covers a portion of the second electrode, and a second portion of the first metal layer is formed overlying the first portion of the first dielectric layer.

16. The method of claim 15 wherein the second portion of the first metal layer forms a first group of stud bumps that contact pads on the bonding surface.

17. The method of claim 16 wherein the first group of stud bumps is electrically insulated from the first electrode, the second electrode, and the first portion of the first metal layer.

18. The method of claim 14 wherein the bonding surface comprises a submount, the structure further comprises:
the submount having pads, wherein the first electrode, the second electrode, and portions of the first metal layer are bonded to the pads,
wherein portions of the first metal layer form stud bumps that overlie the first electrode and the second electrode, and
wherein the stud bumps over the second electrode are electrically insulated from the first portion of the first metal layer at least partially filling the at least one gap.

19. The method of claim 18 wherein the stud bumps over the first electrode are electrically connected to the first electrode and to the first portion of the metal layer.

* * * * *